United States Patent

Ogawa

(10) Patent No.: US 9,602,713 B2
(45) Date of Patent: Mar. 21, 2017

(54) IMAGING APPARATUS AND METHOD FOR CONTROLLING THE SAME

(71) Applicant: CANON KABUSHIKI KAISHA, Tokyo (JP)

(72) Inventor: Takeshi Ogawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/217,795

(22) Filed: Mar. 18, 2014

(65) Prior Publication Data

US 2014/0285707 A1 Sep. 25, 2014

(30) Foreign Application Priority Data

Mar. 21, 2013 (JP) ................................ 2013-058767

(51) Int. Cl.
H04N 5/232 (2006.01)
H04N 5/357 (2011.01)

(52) U.S. Cl.
CPC ....... *H04N 5/23212* (2013.01); *H04N 5/3572* (2013.01)

(58) Field of Classification Search
CPC ... H04N 5/23212; H04N 5/3572; H04N 5/357
See application file for complete search history.

(56) References Cited

U.S. PATENT DOCUMENTS

| 2008/0317454 | A1* | 12/2008 | Onuki | G02B 7/08 396/128 |
| 2010/0182478 | A1* | 7/2010 | Sawada | H04N 9/045 348/311 |
| 2011/0199506 | A1* | 8/2011 | Takamiya | G02B 7/34 348/222.1 |
| 2011/0228127 | A1* | 9/2011 | Nakagawa | G02B 7/34 348/222.1 |
| 2012/0081594 | A1* | 4/2012 | Makigaki | H04N 5/23209 348/340 |
| 2013/0002936 | A1* | 1/2013 | Hirama | H04N 5/23212 348/349 |

(Continued)

FOREIGN PATENT DOCUMENTS

| JP | 2001-003407 A | 3/2001 |
| JP | 2010140013 A | 6/2010 |

(Continued)

*Primary Examiner* — Twyler Haskins
*Assistant Examiner* — Akshay Trehan
(74) *Attorney, Agent, or Firm* — Canon USA, Inc. IP Division

(57) ABSTRACT

In a configuration in which a non-saturated readout value of a division pixel is subtracted from an addition signal of division pixels, an imaging apparatus capable of performing focus detection with respect to a saturated signal is provided. The imaging apparatus includes a subtraction unit and a suppression unit. The subtraction unit obtains the second image signal by subtracting the first image signal output from the image sensor from an addition signal acquired as a sum of the first image signal and the second image signal output from the image sensor, and the suppression unit suppresses the first image signal to a value equal to or less than a predetermined value.

15 Claims, 20 Drawing Sheets

(56) References Cited

U.S. PATENT DOCUMENTS

| | | | | |
|---|---|---|---|---|
| 2013/0088633 A1* | 4/2013 | Williams | ............ | H04N 5/3572 |
| | | | | 348/345 |
| 2013/0120643 A1* | 5/2013 | Tamaki | ................... | G02B 7/28 |
| | | | | 348/349 |
| 2014/0285627 A1* | 9/2014 | Kuboi | ................. | H04N 5/2353 |
| | | | | 348/46 |
| 2014/0307134 A1* | 10/2014 | Kanda | ................ | H04N 5/23212 |
| | | | | 348/280 |

FOREIGN PATENT DOCUMENTS

| | | | |
|---|---|---|---|
| JP | 4691930 | B2 | 6/2011 |
| KR | 20100053558 | A | 5/2010 |

* cited by examiner

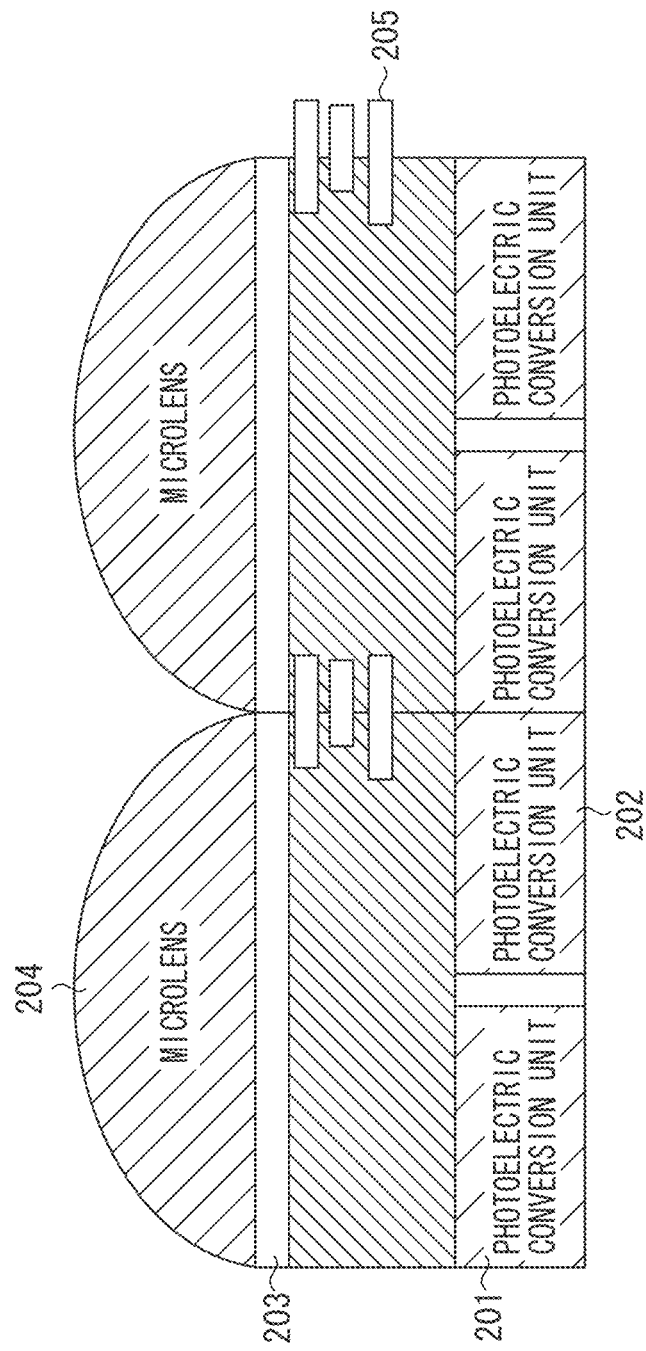

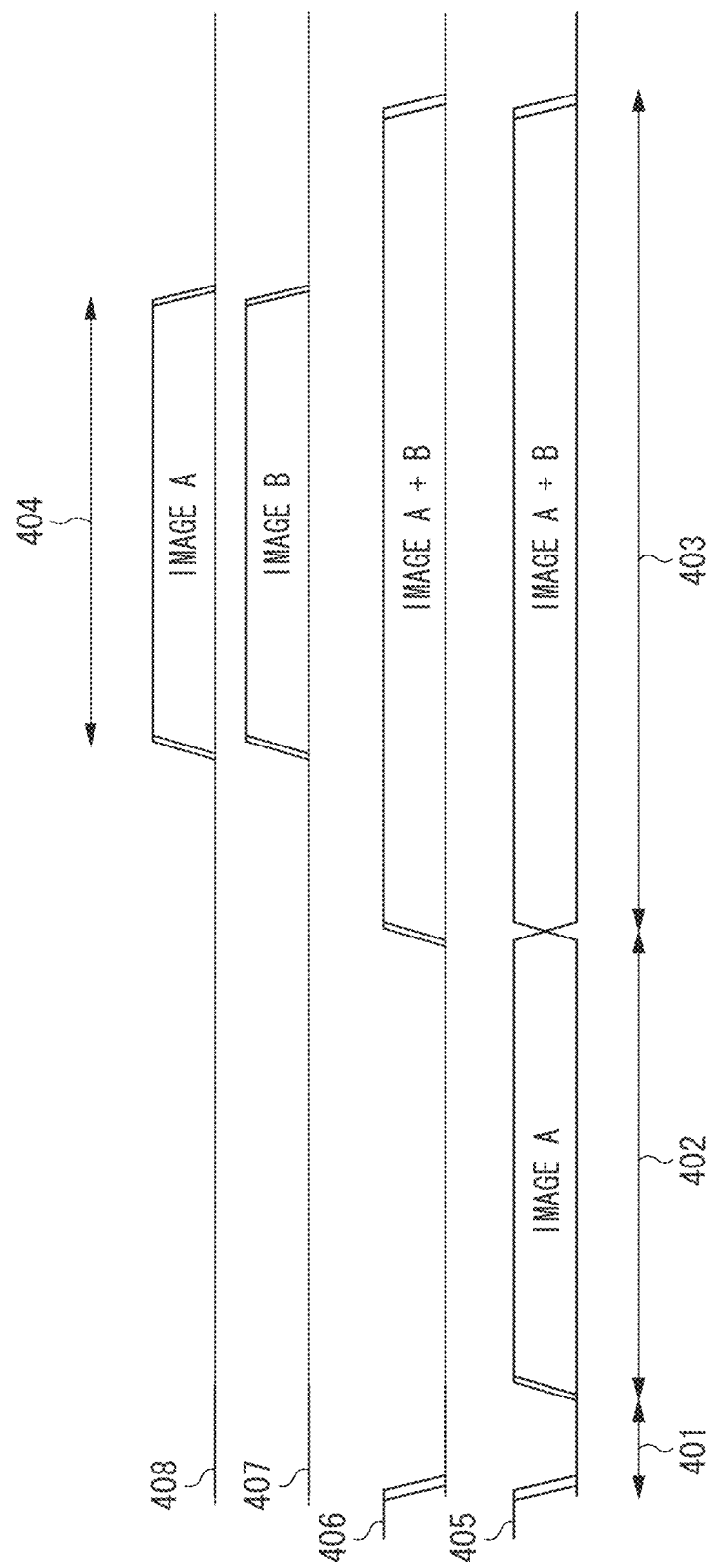

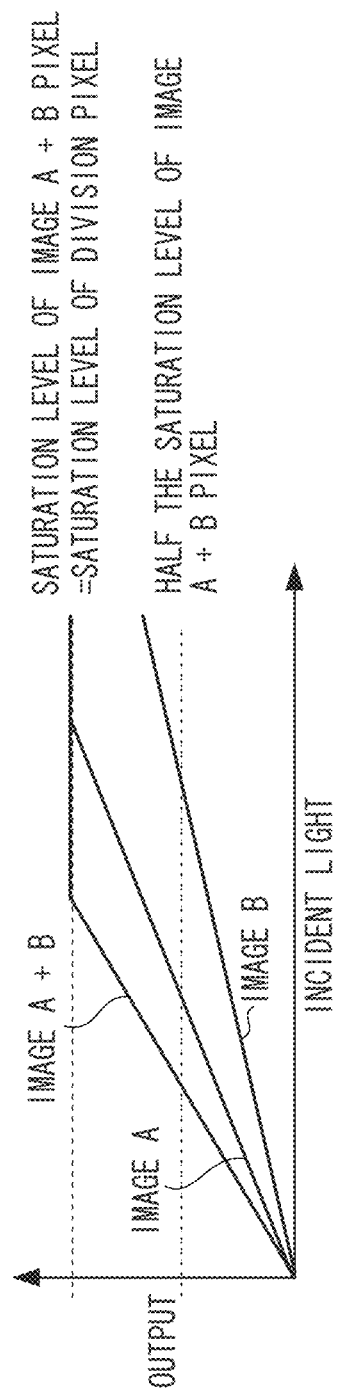

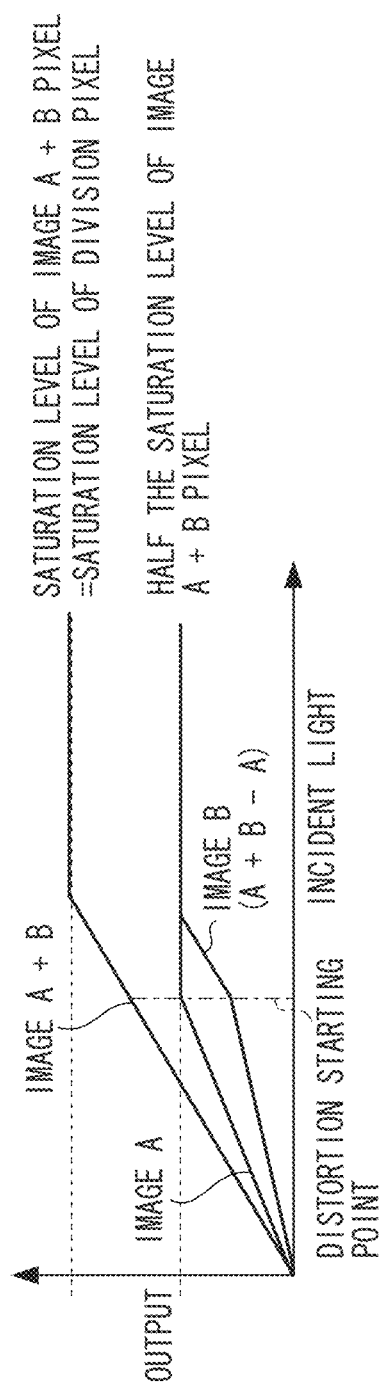

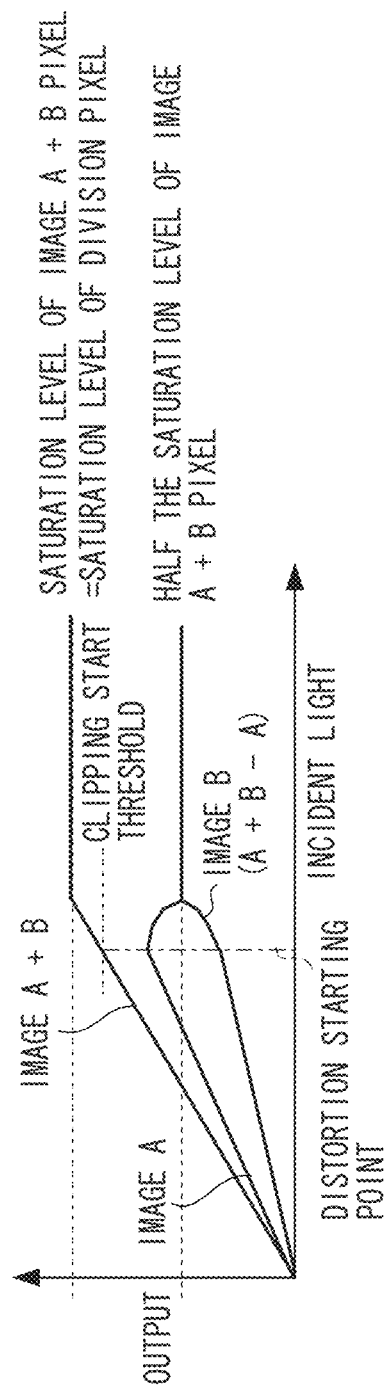

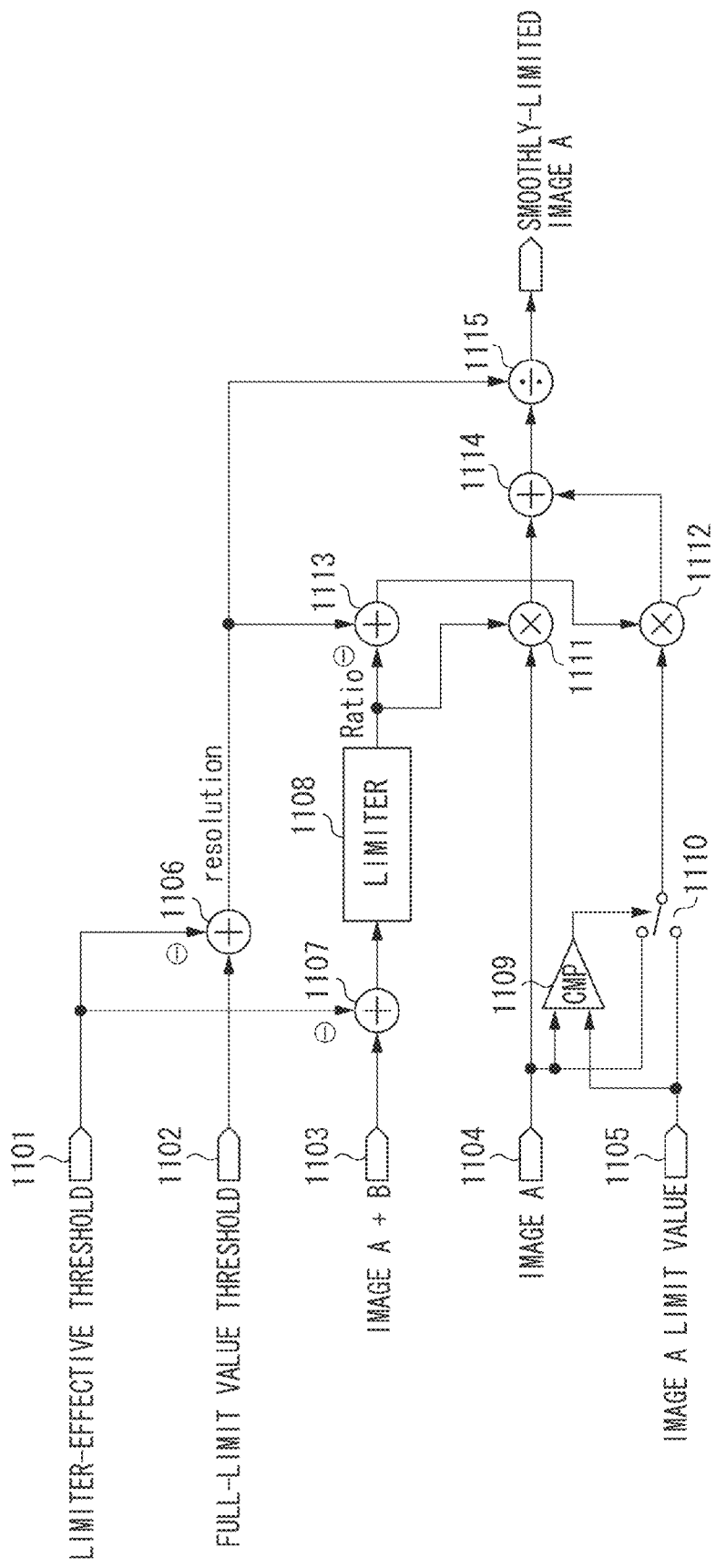

FIG. 15A
IN-FOCUS
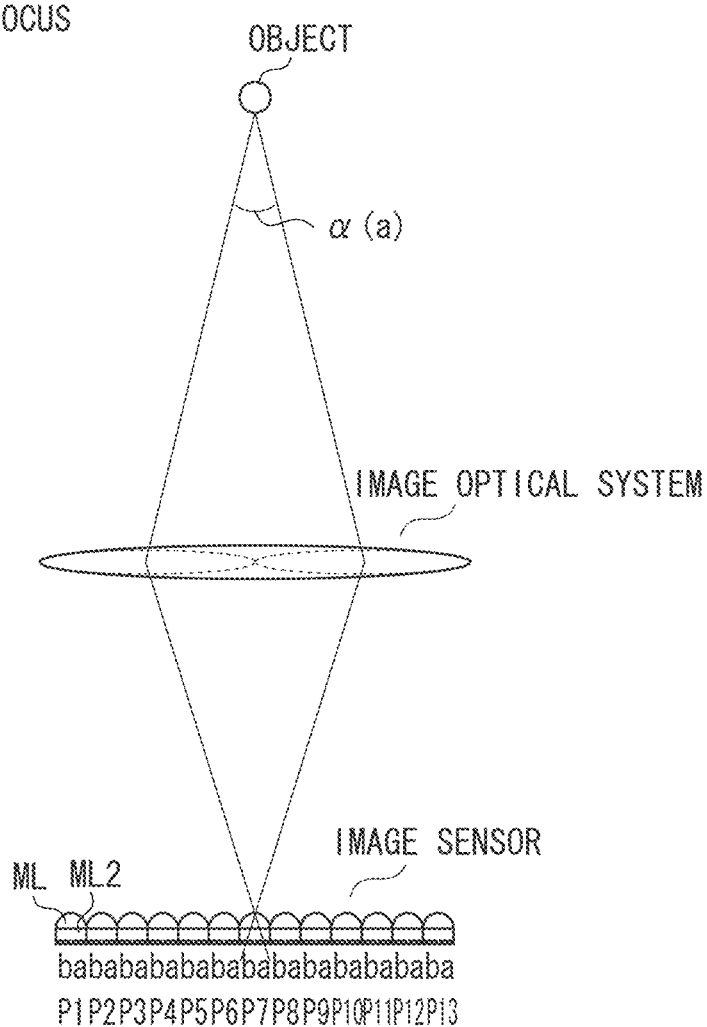
$|d(a)| \fallingdotseq 0$
—— IMAGE A PIXEL GROUP
······ IMAGE B PIXEL GROUP FIG. 15B
REAR-FOCUS
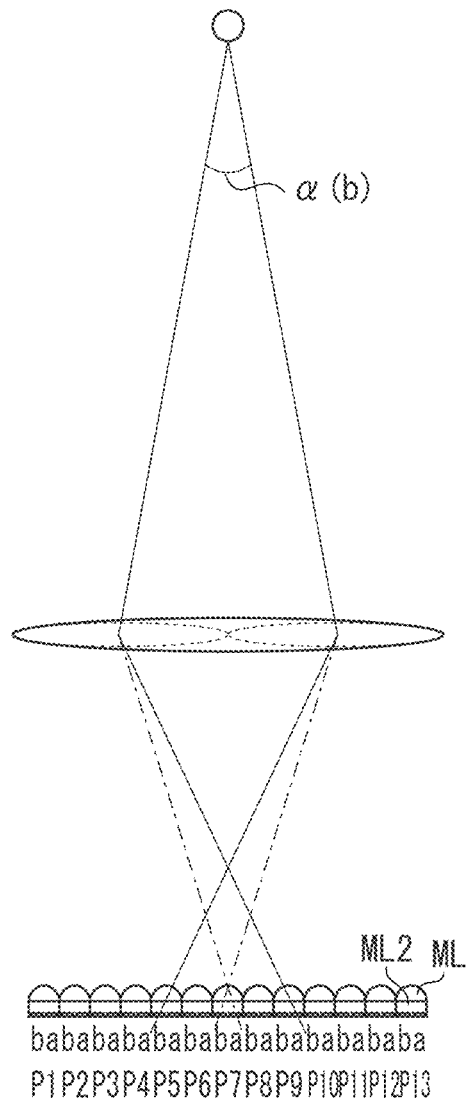
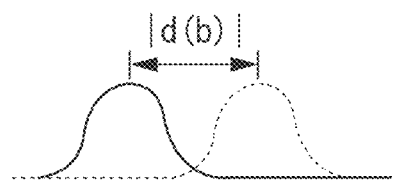
—— IMAGE A PIXEL GROUP
----- IMAGE B PIXEL GROUP

FRONT-FOCUS

IMAGING APPARATUS AND METHOD FOR CONTROLLING THE SAME

BACKGROUND

Technical Field

The present disclosure relates to an imaging apparatus and a method for controlling the imaging apparatus. The present disclosure also relates to a technique for obtaining a pupil division image using an image sensor configured of a microlens corresponding to a plurality of photoelectric conversion units, and more particularly to a technique for preferably correcting distortion of an image caused by saturation occurring in each of the photoelectric conversion units of a pixel.

Description of the Related Art

Conventionally, there has been provided a technique for performing focus detection using an image sensor configured of a microlens corresponding to a plurality of photoelectric conversion units, in which pupil-divided images are obtained and a phase difference between the two obtained pupil-divided images is acquired.

For example, Japanese Patent Application Laid-Open No. 2001-83407 discusses a technique for generating a view image by a conventional signal processing technique, in which focus detection is performed by acquiring a phase difference of pupil-divided images while all values of photoelectric conversion units corresponding to the same microlens are added up to treat that addition value as a value of one pixel so that the pixel array thereof is the same as that of the conventional imaging pixel.

In Japanese Patent No. 4691930, after a value corresponding to the electric charge generated at a part of photoelectric conversion units within the same microlens is read in a non-saturated state, an addition value corresponding to the electric charges generated at all of the photoelectric conversion units within the same microlens is read. Then, a value of other photoelectric conversion units is estimated from a difference value between the read values, so that a phase-difference image signal can be obtained while the high-sensitivity characteristics of an imaging pixel signal are maintained.

However, in the above-described conventional technique discussed in Japanese Patent No. 4691930, there arises a problem in which a signal waveform is distorted remarkably due to saturation that occurs when gain is increased in order to have higher International Standards Organization (ISO) sensitivity.

For example, in a case where an image sensor designed for ISO 100 is used in ISO 200, a signal amplitude thereof is doubled by increasing gain.

In ISO200, with half the saturation level of electric charges that can be stored in a pixel of the image sensor, an analog-digital (AD) converter exceeds its conversion range to reach the apparent saturation level. An amount of electric charges that can be stored in the division pixel as the addition value thereof is up to twice as much as the amount of AD conversion range. In such a state, even if a value of one division pixel is subtracted from an addition value of the division pixels, a value of another division pixel cannot be restored.

In an extreme case, if both the addition value of electric charges generated at all photoelectric conversion units and the value of the electric charges of one photoelectric conversion unit reach the saturation level, this gives rise to a phenomenon in which another value thereof becomes zero when the one value is subtracted from the addition value. In such a case, even if the focus detection is performed by acquiring the phase difference of two pupil-divided images obtained in such a state, the focus detection cannot be performed correctly.

SUMMARY

Therefore, in a configuration in which a non-saturated read value of a division pixel is subtracted from an addition signal value of division pixels, the present disclosure is directed to an imaging apparatus capable of performing focus detection with respect to a saturated signal.

According to an aspect of the present invention, an imaging apparatus includes: an image sensor configured of an imaging pixel having a plurality of photoelectric conversion units; and a focus adjustment unit which performs a phase-difference detection type focus adjustment using a pair of image signals detected by a plurality of the photoelectric conversion units. The imaging apparatus includes a subtraction unit and a suppression unit. One signal of a pair of the image signals is a first image signal whereas the other signal of a pair of the image signals is a second image signal. The subtraction unit generates the second image signal by subtracting the first image signal, that is output from the image sensor, from an addition signal that is acquired by adding the first image signal and the second image signal output from the image sensor, and the suppression unit suppresses the first image signal to a value equal to or less than a predetermined value.

Further features of the present invention will become apparent from the following description of exemplary embodiments with reference to the attached drawings.

BRIEF DESCRIPTION OF THE DRAWINGS

FIG. 2 is a cross-sectional view of an image sensor according to the exemplary embodiment of the present invention.

FIG. 4 is a timing chart of respective portions according to the exemplary embodiment of the present invention.

FIGS. 10A through 10C are graphs illustrating output characteristics of incident light according to the third exemplary embodiment of the present invention.

FIG. 11 is a circuit block diagram according to the third exemplary embodiment of the present invention.

FIGS. 15A through 15C are principle diagrams of imaging plane phase-difference autofocus (AF) according to the exemplary embodiment of the present invention.

DESCRIPTION OF THE EMBODIMENTS

Figure 1:
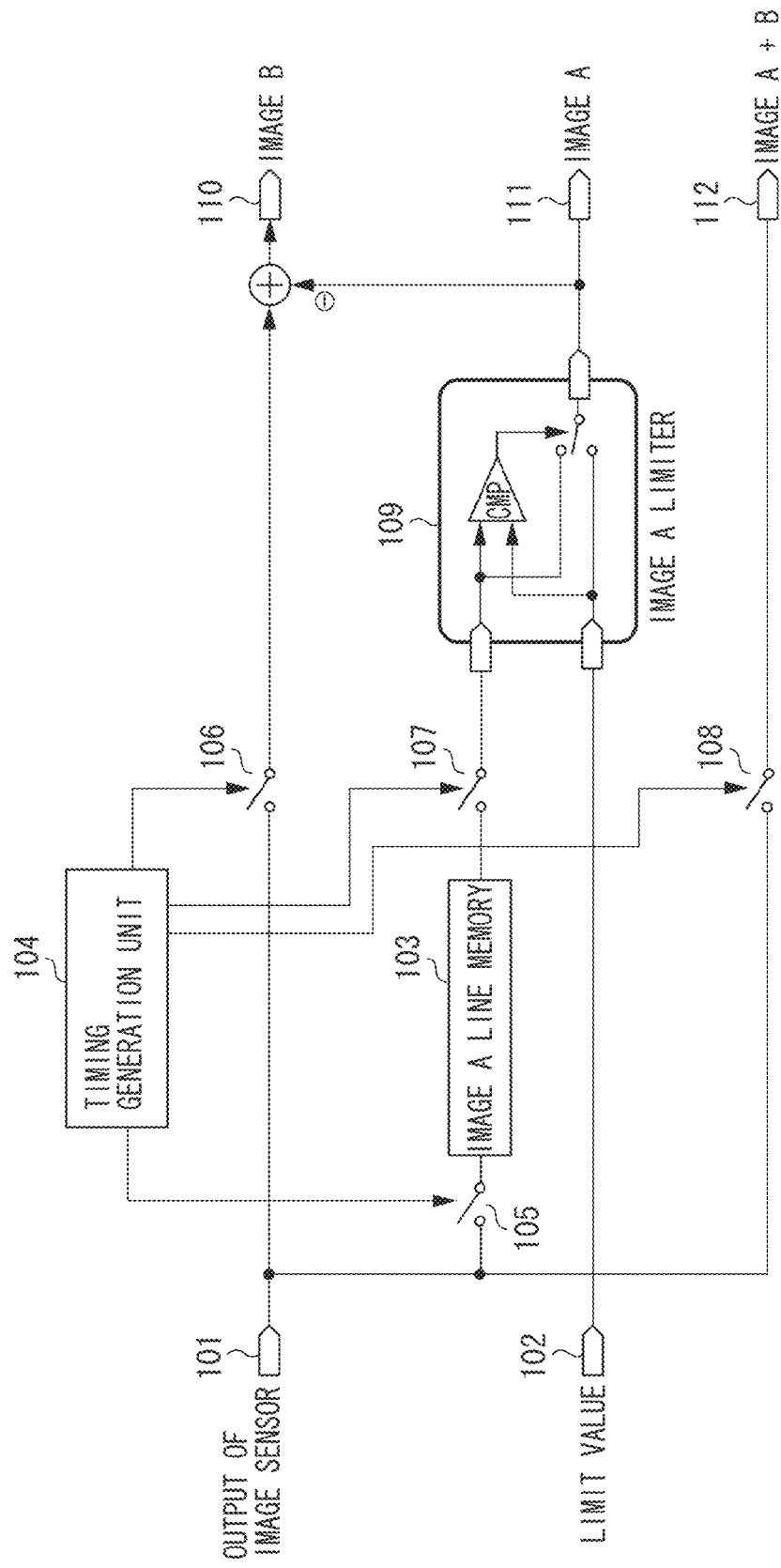
FIG. 1 is a block diagram illustrating a focus detection pixel separation unit according to an exemplary embodiment of the present invention.

Various exemplary embodiments, features, and aspects of the invention will be described in detail below with reference to the drawings.

FIG. 2 is a cross-sectional view illustrating a pixel of an image sensor according to the exemplary embodiment of the present invention. The pixel includes a microlens 204, a color filter 203, photoelectric conversion units 201 and 202, and a wiring layer 205. As illustrated in FIG. 2, pupil division is performed by providing one microlens with the two photoelectric conversion units 201 and 202, and focus detection is performed using a phase difference of the images obtained from the respective photoelectric conversion units 201 and 202.

Further, a complete-pupil image can be obtained by adding the values of the photoelectric conversion units 201 and 202. Because the color filter 203 is configured of respective filters of red (R), green (G), and blue (B) arranged in a Bayer array, a color image can be obtained using an addition image of the photoelectric conversion units 201 and 202.

An image obtained from the photoelectric conversion unit 201 is referred to as an image A, an image obtained from the photoelectric conversion unit 202 is referred to as an image B, and an image obtained by adding the images of the photoelectric conversion units 201 and 202 is referred to as an image A+B.

The image sensor according to the exemplary embodiment of the present invention includes a function for reading only the image A in a non-saturated state, and a function for adding up and reading the electric charges of the photoelectric conversion units 201 and 202 as the image A+B.

Figure 5:
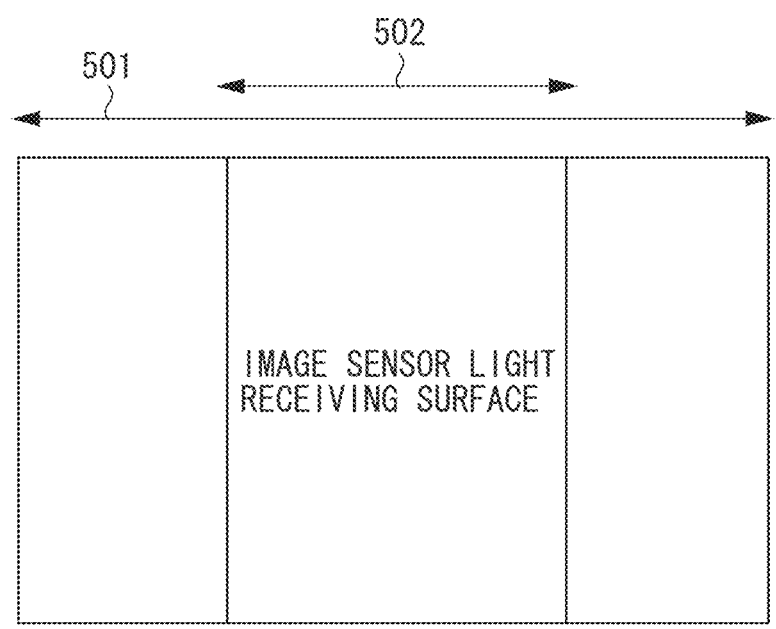
FIG. 5 is an area divisional diagram of the image sensor according to the exemplary embodiment of the present invention.

FIG. 5 is a diagram illustrating a light receiving surface of the image sensor according to the exemplary embodiment of the present invention. A width 501 represents effective pixels of the entire image sensor, serving as a readout area of the image A+B.

A width 502 represents an area into which the image A can be read.

In order to reduce the time taken for the image sensor to read images, the image sensor is designed to read the image A into only an area used for the focus detection.

Readout timing of the image sensor according to the exemplary embodiment of the present invention will be described with reference to a timing chart in FIG. 4.

In FIG. 4, a signal 405 represents one horizontal period of readout signal of the image sensor. The signal 405 includes a horizontal blanking period 401, an image A readout period 402, and an image A+B readout period 403. As illustrated in FIG. 4, required information can be read within a shorter horizontal period than that for the case of reading the image A and the image B individually.

In the imaging apparatus according to the exemplary embodiment of the present invention, the image B is obtained by subtracting the read image A from the read image A+B.

A problem of the conventional technique will be described with reference to the graphs of FIGS. 3A and 3B which illustrate the characteristics thereof.

Figure 3A:
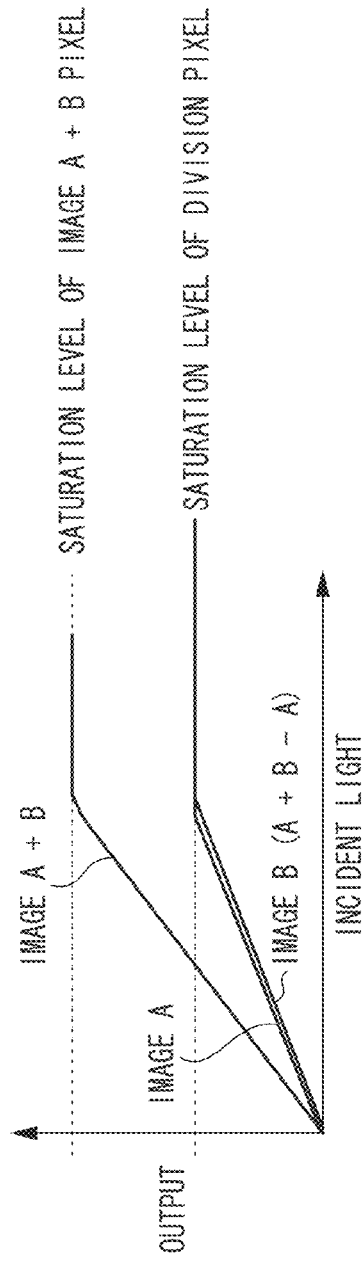
FIGS. 3A and 3B are graphs illustrating output characteristics of incident light according to the exemplary embodiment of the present invention.

FIG. 3A is a graph illustrating the characteristics of the image sensor in a case of ISO 100. In FIG. 3A, sensitivity of the image sensor is illustrated as "ISO 100" for convenience because the image sensor is commonly designed based on ISO100. Therefore, this "ISO 100" is used synonymously with the minimum sensitivity of the image sensor.

In FIG. 3A, a horizontal axis is an amount of incident light whereas a vertical axis is an output level. In both the images A and B, the outputs are increased according to the amount of incident light. However, after the images A and B have reached the saturation levels, the output levels will not be increased even though the amount of incident light is increased.

This is because the amount of electric charges that are photo-electrically converted in proportion to the amount of incident light exceeds the storage capacity of the pixel.

Because the image A+B is an addition value of signal levels of the images A and B, if both the images A and B are saturated, the output level thereof will not be increased even if the amount of incident light is increased.

Figure 3B:
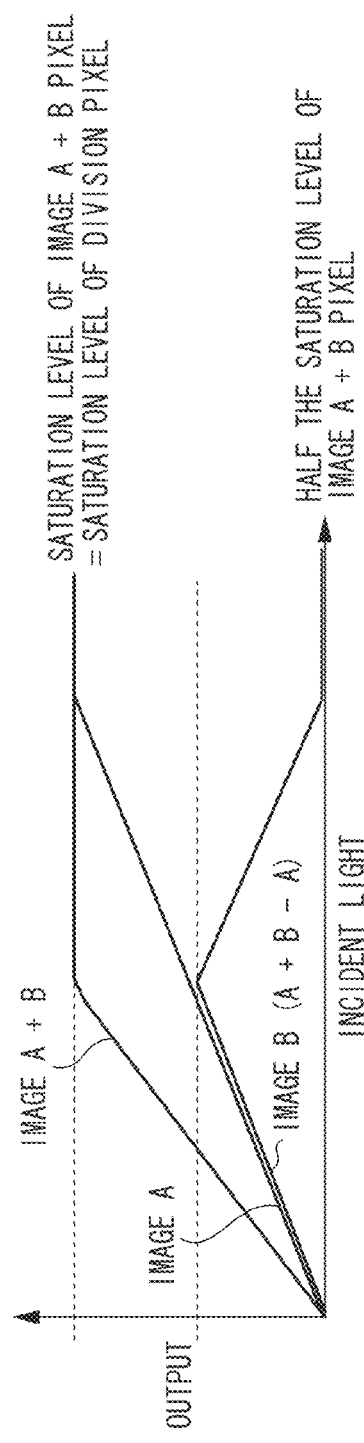

On the contrary, FIG. 3B is a graph illustrating the characteristics of the image sensor in a case of ISO 200 in which the signal is amplified to twice as much as that in ISO 100.

Because the sensitivity of photoelectric conversion characteristics of the image sensor cannot be changed, in a case where the image sensor is used at higher sensitivity, change in sensitivity is realized by increasing the gain of an analog amplifier prior to AD conversion.

Therefore, the saturation level in ISO200 is determined according to the AD conversion range.

Accordingly, even if the signal level is saturated, the electric charges converted by a photoelectric conversion element are continuously accumulated in the pixel. In FIG. 3B, the output level of the image A signal continuously rises up even though the image A+B reaches the saturation level of the AD conversion range, so that the output level thereof reaches a value that is the same as the saturation level of the image A+B.

The image B has the same characteristics as that of the image A. However, an output of the image B generated by subtracting the image A from the image A+B starts decreasing when the output of the image A exceeds half the saturation level of the image A+B and becomes zero when the signal level of the image A conforms to the image A+B.

Figure 7A:
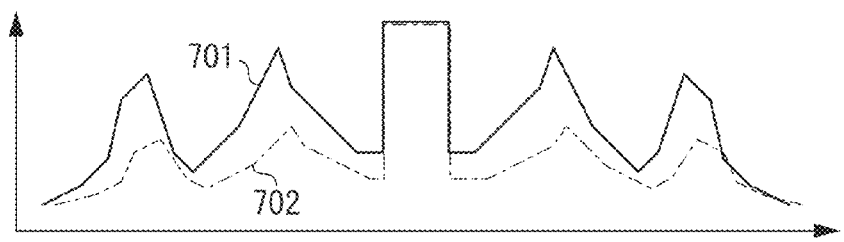
FIGS. 7A through 7C are waveform charts illustrating respective portions of signals according to the exemplary embodiment of the present invention.
Figure 7B:
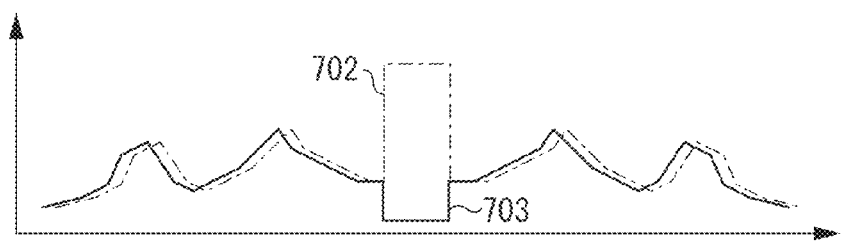
Figure 7C:
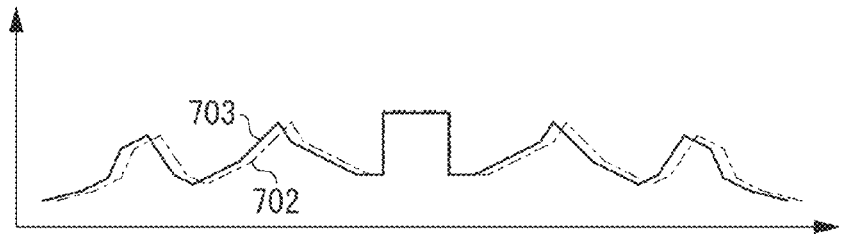

The image B signal in a saturation state will be described with reference to signal waveform charts in FIGS. 7A through 7C. In FIG. 7A, an image A+B 701 is a waveform of the image A+B, whereas an image A 702 is a waveform of the image A. The saturation occurs at the central portions of the waveforms 701 and 702. FIG. 7B illustrates a waveform of the image B generated by the characteristics of FIG. 3B. The image A 702 is a waveform of the image A, whereas an image B 703 is a waveform of the image B. A signal level of the image B 703 is zero at the portion where the image A 702 is saturated. In the focus detection, the phase difference between the image A and the image B has to be detected.

However, a result of the focus detection will be deviated because the image is considerably distorted at the saturated portion.

A purpose of the present invention is to solve the above problem.

In order to solve the above problem, an imaging apparatus includes: an image sensor configured of an imaging pixel having a plurality of photoelectric conversion units; and a focus adjustment unit which performs an imaging plane phase-difference detection type focus adjustment using a pair of image signals detected by a plurality of the photoelectric conversion units. The imaging apparatus includes a subtraction unit and a suppression unit. One signal of a pair of the image signals is a first image signal whereas the other signal of a pair of the image signals is a second image signal. The subtraction unit generates the second image signal by subtracting the first image signal, that is output from the image sensor, from an addition signal that is acquired by adding the first image signal and the second image signal output from the image sensor, and the suppression unit suppresses the first image signal to a value equal to or less than a predetermined value.

The addition signal is an image signal of the image A+B, whereas the second image signal is either an image signal of the image A or an image signal of the image B.

An optical principle of the imaging plane phase-difference AF according to the first through fourth exemplary embodiments of the present invention will be described with reference to FIGS. 15A through 15C.

Hereinafter, a range-finding information acquisition operation of the imaging apparatus using the images A and B will be described with reference to FIGS. 15A through 15C.

Figure 15C:
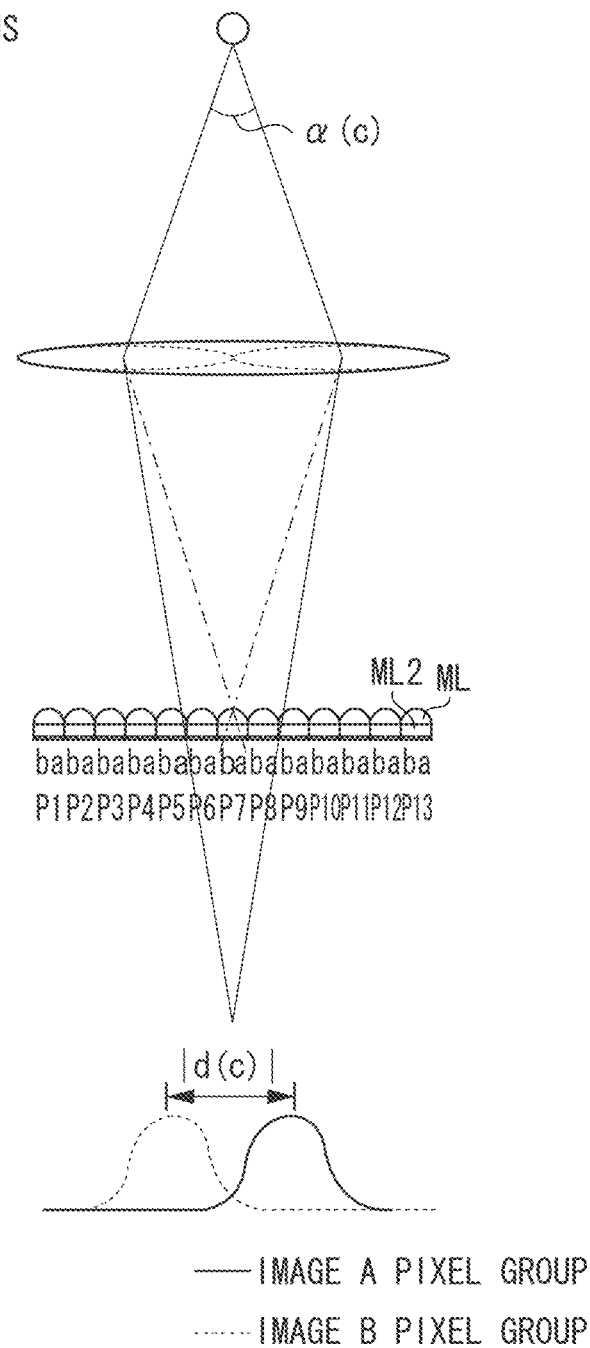

As illustrated in FIGS. 15A through 15C, the image sensor includes a plurality of unit pixel cells P having pixels a and b that are separately arranged under each microlens (ML). It is known that the pixels a and b arranged under the ML are pupil-divided pixels that take the ML as an exit pupil.

When the range-finding operation is performed, outputs of the image A pixel and the image B pixel configured of pixels a and b are respectively combined in a column direction (or row direction), and each of the outputs of the image A and the image B is generated and processed as an output of a pixel cell group of a same color unit. Thereafter, disparity between corresponding points thereof is acquired by correlation calculation. A result of the correlation calculation can be acquired by the following formula.

$$C=\Sigma |YAn-YBn|$$ <Formula>

In the above, "n" represents number of microlenses in a horizontal direction. Further, a value acquired by shifting the corresponding pixel relative to YBn is plotted, and a disparity amount having the smallest value is determined to be an in-focus position. The relationship between the amount of disparity (parallax) and the in-focus state is illustrated in the lower portions of FIGS. 15A through 15C.

As illustrated in FIG. 15A, in the in-focus state, an image-forming position of the image optical system is a position PD under the ML of the unit pixel cell P7, so that the pixel group of the image A and the pixel group of the image B approximately conform to each other. At this time, a value of an image disparity amount D(a) of the image A pixel group and the image B pixel group acquired by the correlation calculation is approximately close to zero.

As illustrated in FIG. 15B, in a rear-focus state, as the image-forming positions of the image optical system, a pixel for the image A comes under the ML of the unit pixel cell P5, and a pixel for the image B comes under the ML of the unit pixel cell P9. At this time, an image disparity amount D(b) of the image A pixel group and the image B pixel group is acquired by the correlation calculation.

As illustrated in FIG. 15C, in a front-focus state, as the image-forming positions of the image optical system, a pixel for the image A pixel comes under the ML of the unit pixel cell P9, and a pixel for the image B pixel comes under the ML of the unit pixel cell P5. At this time, an image disparity amount D(c), disparity between the image A pixel group and the image B pixel group shifted in a direction opposite to a disparity direction of the rear-focus state in FIG. 15B, is acquired by the correlation calculation. This indicates that the image A pixel group and the image B pixel group "observe" the identical object in the in-focus state, while in the rear focus state and the front-focus state, the image A pixel group and the image B pixel group "observe" the object shifted by an image disparity amount D.

In the actual in-focus operation, a defocus amount is obtained by a known technique based on the image disparity amount D and a base-line length, and output to a driving unit. Then, the in-focus operation with respect to the object is performed by moving the image optical system.

Hereinafter, the imaging apparatus according to the first exemplary embodiment of the present invention will be described with reference to a block diagram in FIG. 6. The imaging apparatus includes a focusing lens 601, an image sensor 602 including a pixel configuration illustrated in FIG. 2, and a focus detection pixel separation unit 604.

Based on an output 603 from the image sensor 602, the image is separated into images A, B, and A+B by the focus detection pixel separation unit 604. The image A+B is input to a signal processing circuit 607, so as to be converted into a color video signal. The images A and B are input to a focus detection circuit 608 and used for the focus detection. A control microcomputer 609 reads a focus detection result acquired by the focus detection circuit 608 and controls the focusing lens 601. The control microcomputer 609 controls the entire imaging apparatus. The control microcomputer 609 includes a function of a subtraction unit.

Figure 6:
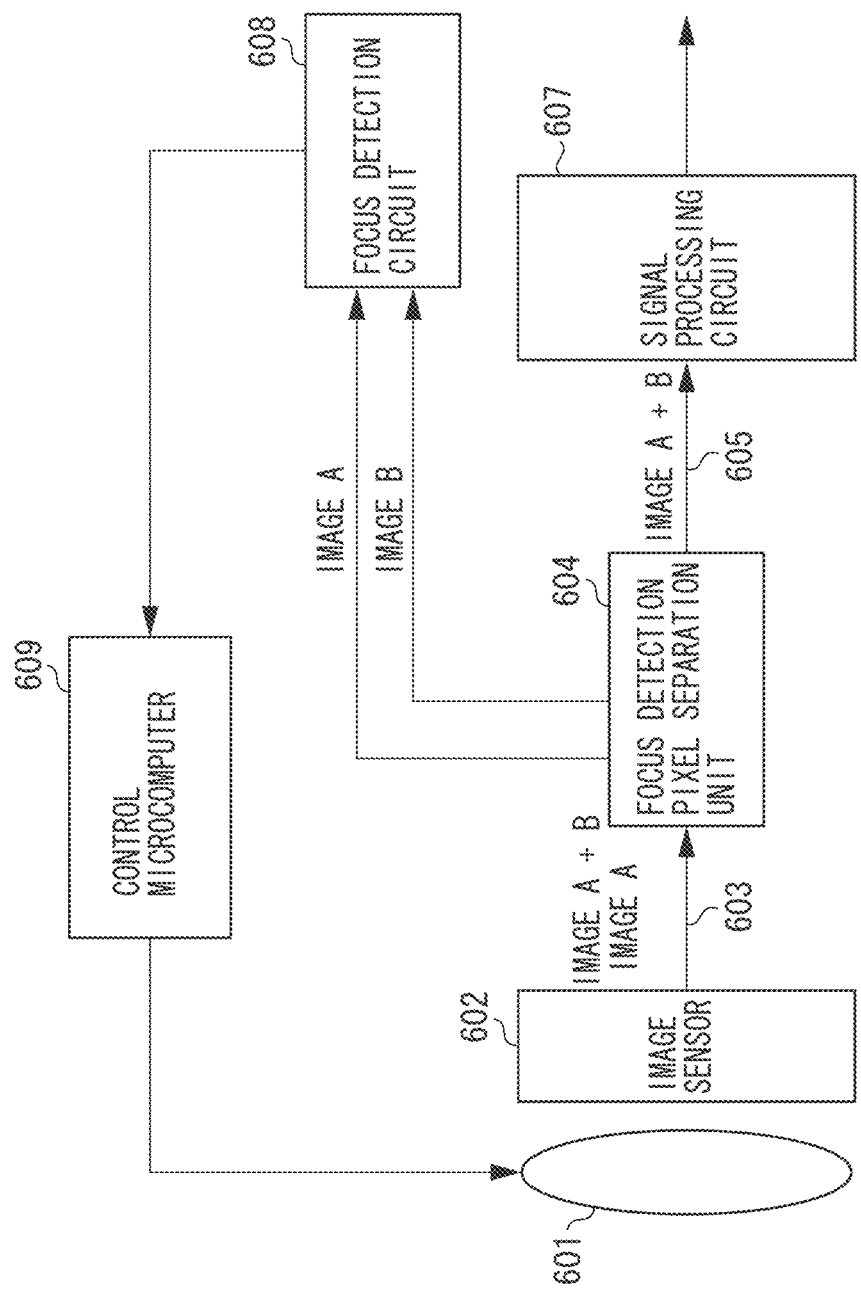
FIG. 6 is a block diagram illustrating an imaging apparatus according to a first exemplary embodiment of the present invention.

FIG. 1 is a block diagram illustrating an internal circuit of the focus detection pixel separation unit 604 of FIG. 6. An output 101 is the output of the image sensor 602, and a line memory 103 stores an image A signal. A timing generation unit 104 controls the timing of the focus detection pixel separation unit 604. With respect to an input signal, the timing generation unit 104 synchronizes the image A+B with the image A by controlling switches 105, 106, 107, and 108 at a predetermined timing.

The timing will be described with reference to the timing chart of FIG. 4. The signal 405 represents the output signal 101. The signal 405 is input in the order of the horizontal blanking period 401, the image A readout period 402, and the image A+B readout period 403. An image A signal input in the image A readout period 402 is input to the image A line memory 103 by the switch 105.

Then, the switches 106 and 107 communicate with each other in a period 404, so that the image A signal is synchronized with the image A+B signal. A waveform 408 is output from the image A line memory 103. An image A limiter unit 109 serves as a suppression unit according to the present invention. The image A limiter unit 109 compares an input limit value 102 with an output of the switch 107. Then, in a case where the output thereof exceeds the limit value 102, the image A limiter unit 109 replaces the output with the limit value 102 by switching an internal switch.

The thus generated image A signal is subtracted from the image A+B signal output from the switch 106, so that the image B signal is generated and output to a terminal 110. In addition, the control microcomputer 609 sets an appropriate value as the limit value 102.

In the first exemplary embodiment, the limit value 102 is set to a value approximately half of the saturation level of the image A+B. In the timing chart of FIG. 4, signals 408 and 407 represent the synchronized images A and B, respectively. A signal 406 represents the image A+B output from the switch 108. Because the image A limiter unit 109 is provided, the characteristics illustrated in FIG. 3A can be obtained even if the gain is increased to have the higher sensitivity such as ISO200. FIG. 7C is a waveform chart illustrating the waveforms of the image A and the image B for the case where the value of the image A is restricted by the image A limiter unit 109 so as not to exceed a predetermined value. The image A 702 is a waveform of the image A, whereas the image B 703 is a waveform of the image B. As illustrated in FIG. 7C, because conformity level of the image A and the image B is increased, a preferable result can be acquired by the correlation calculation, and accuracy of the focus detection will be improved.

In the focus detection circuit 608 of FIG. 6, a defocus amount will be calculated by acquiring the amount of disparity between the image A and the image B. However, detailed descriptions thereof will be omitted as it departs from the essential spirit of the present invention.

Hereinafter, the imaging apparatus according to the second exemplary embodiment will be described with reference to the flowchart in FIG. 8. In the first exemplary embodiment, each of the image A limiter unit 109 and the focus detection pixel separation unit 604 is configured of a circuit. In the present exemplary embodiment, a function as a suppression unit is executed by a microcomputer.

Figure 8:
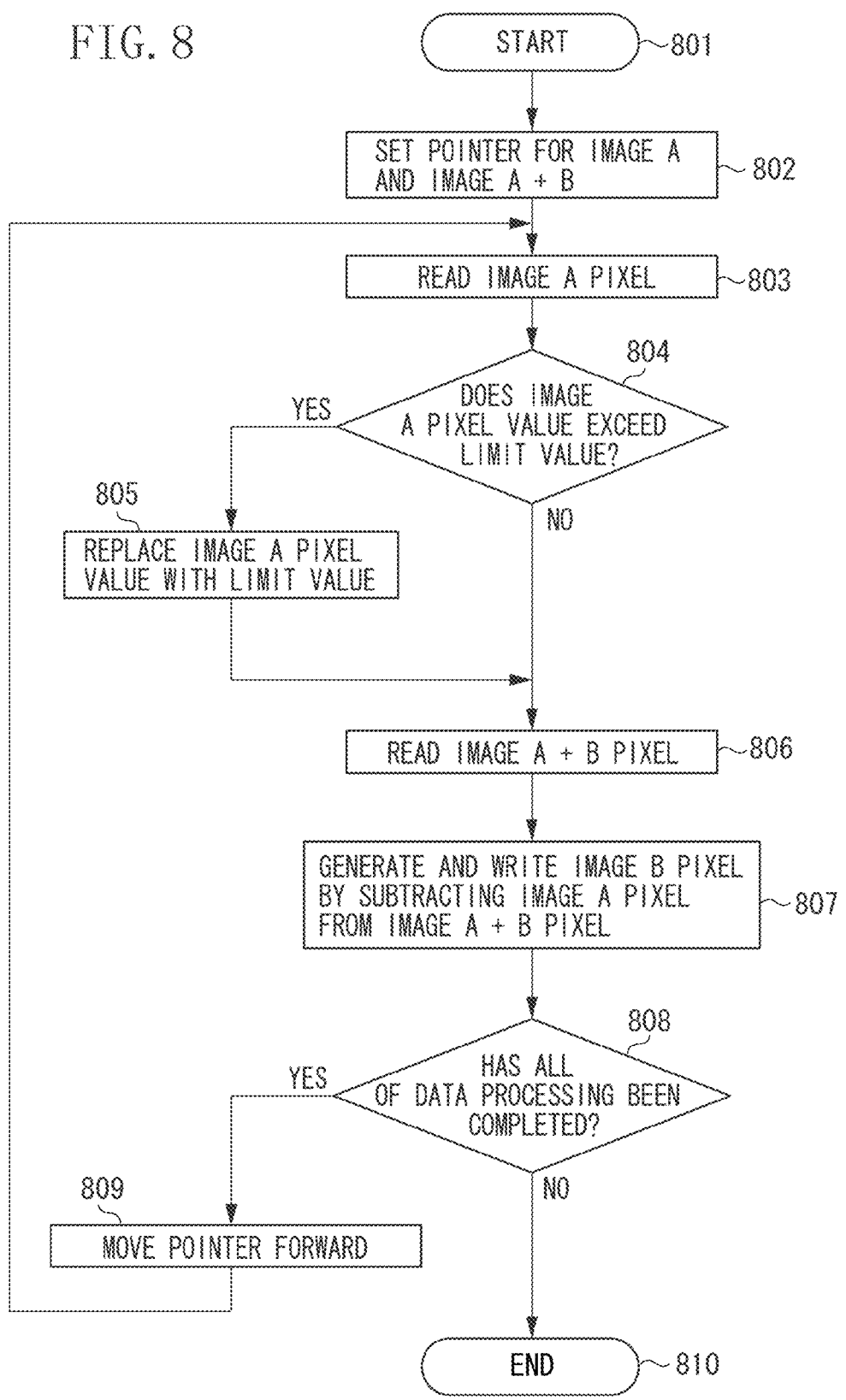
FIG. 8 is a flowchart of a program for focus detection pixel separation processing according to a second exemplary embodiment of the present invention.

FIG. 8 is a flowchart of the program of limit processing of the image A and separation processing of the image B, each of which is executed based on the images A and A+B stored in a memory of the microcomputer.

In step S801, a central processing unit (CPU) starts the program. In step S802, the CPU initializes the addresses in the memory where the input images A, A+B, and the output image B are stored. In step S803, the CPU reads the image A pixel. In step S804, the CPU compares a value of the image A pixel with the limit value. In a case where the value of the image A pixel exceeds the limit value (YES in step S804), the processing proceeds to step S805. In step S805, the CPU replaces the value of the image A pixel with the limit value. In any of the cases where the CPU does not advance or it advances the processing to step S805 from step S804, the CPU subsequently advances the processing to step S806 and reads the image A+B pixel. In a case where the value of the image A pixel does not exceed the limit value (NO in step S804), the processing proceeds to step S806. In step S806, the CPU reads the image A+B pixel.

In step S807, the CPU subtracts the image A pixel from the image A+B pixel to generate the image B pixel, and writes the image B pixel into the memory area of the image B pixel. In step S808, the CPU determines whether all of the pixels have been processed. In a case where the processing thereof has not been completed (NO in step S808), the processing proceeds to step S809. In step S809, the CPU moves an input-output pointer forward and advances the processing to step S803.

The CPU repeatedly executes the processing in steps S803 through S808 for all of the pixels. When all of the pixels have been processed (YES in step S808), the processing proceeds to step S810 so that the CPU ends the processing.

Figure 9A:
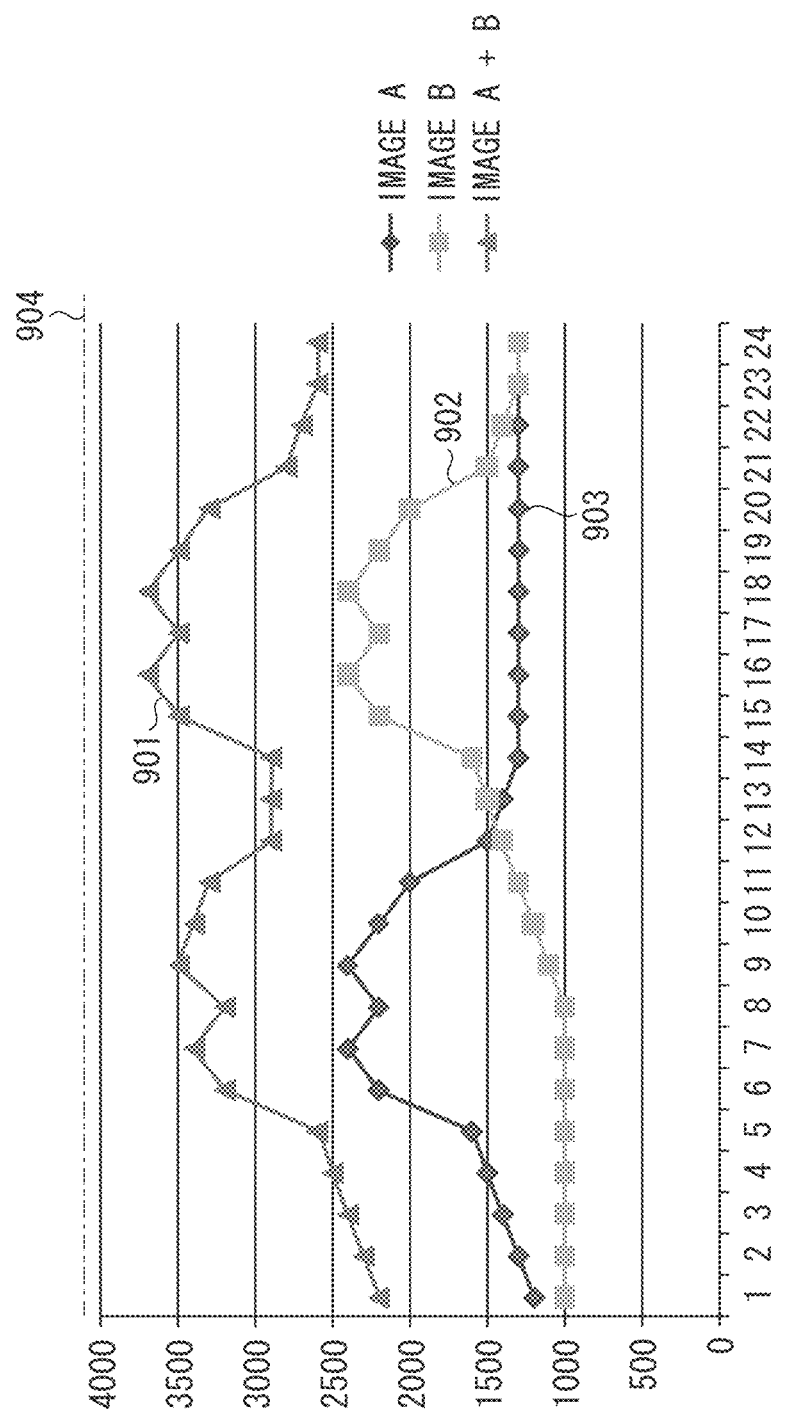
FIGS. 9A and 9B are waveform charts illustrating signal waveforms of images A, A+B, and B according to third and fourth exemplary embodiments of the present invention.
Figure 9B:
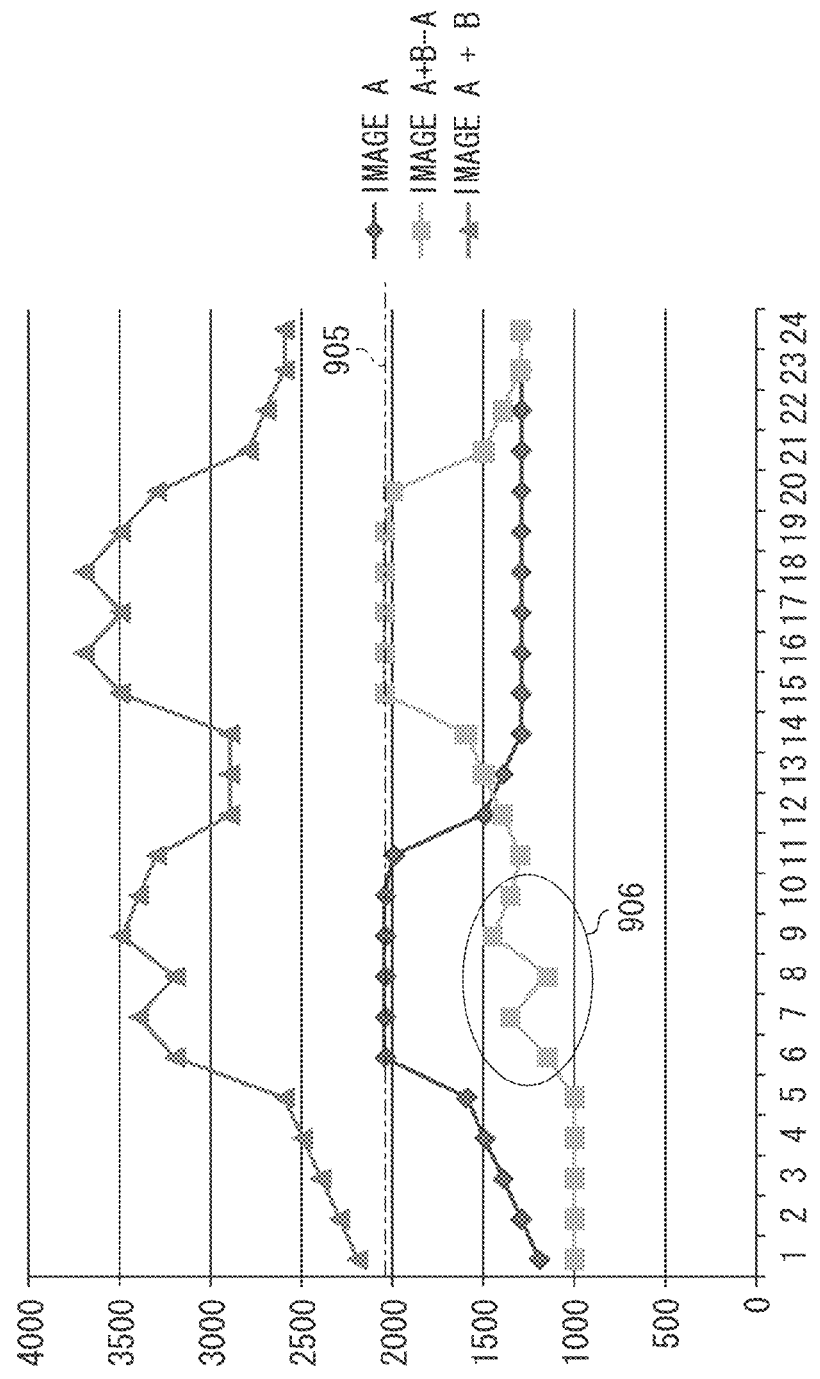

Hereinafter, the third exemplary embodiment will be described. FIG. 9A is a waveform chart illustrating the signals of the images A, A+B, and B. An image A+B 901 is a signal waveform of the image A+B, an image B 902 is a signal waveform of the image B, and an image A 903 is a signal waveform of the image A. FIG. 9B illustrates the signal waveforms of the image A 903 and the image B 902 which are obtained using the circuit described in the first exemplary embodiment.

A line 905 represents a limit value for the image A 903 and the image B 902. At this time, because the image A+B 901 has not yet reached the saturation level, the image B 902 can be obtained correctly even if the image A 903 is not limited to the limit value. However, because the image A 903 is limited, the amplitude originally included in the image A 903 is transferred to the image B 902 after the subtraction.

In FIG. 9B, an area indicated by a portion 906 shows that the amplitude of the image A 903 is transferred to the image B 902. When the image A+B 901 is not saturated, the image B 902 can be correctly obtained by the subtraction even if the image A 903 exceeds the predetermined value (threshold). Therefore, in order to prevent the above-described phenomenon, a value thereof may be replaced with the limit value after determining whether the image A+B 901 is saturated.

If the value is replaced with a limit value depending on whether the image A+B 901 is saturated, there is a risk in which the signal level may abruptly change at a replaced portion. Because such an abrupt change in signal level may cause unnatural noise, the limit value and the non-limit value have to be replaced smoothly.

FIG. 10C is a graph illustrating a relationship between the incident light amount and the output for the case where the non-limit value is smoothly replaced with the limit value. Mixing ratio of the limit value to the non-limit value is gradually changed from the value slightly less than the saturation value of the image A+B 901, so that the value thereof is completely changed to the limit value at the point where the image A+B 901 has reached the saturation level. As described above, when the image A+B 901 is not near the saturation point, the limit value will not be applied. With this configuration, the images A 903 and B 902 as illustrated in FIG. 9A can be obtained in many cases.

A configuration of the present exemplary embodiment will be described with reference to the circuit diagram illustrated in FIG. 11. FIG. 11 is a circuit diagram according to the present exemplary embodiment, illustrating a portion corresponding to the image A limiter unit 109 of FIG. 1. An image A limit value 1105 is the same limit value as described in the first exemplary embodiment. A signal immediately after a switch 1110 is the same signal as described in the first exemplary embodiment. In the present exemplary embodiment, the image A+B is also employed in addition to the signal of the configuration described in the first exemplary embodiment. A difference between an image A+B 1103 and a limiter effective predetermined value (threshold) 1101 is acquired by a calculation unit 1107, and an acquired value is input to a limiter 1108. The limiter 1108 replaces a negative value with zero. Accordingly, when a value of the image A+B 1103 is less than the limiter effective predetermined value (threshold value) 1101, a value of the limiter 1108 will be zero.

A value that is to be input as a full-limit threshold 1102 is a predetermined value (threshold) that is fully replaced with the limit value. In general, a value equivalent to the saturation level of the image A+B is set thereto. A subtraction unit 1106 outputs a difference value between the limiter effective predetermined value (threshold) 1101 and the saturation level. This difference value serves as a resolution for change in the mixing ratio of the limit value to the non-limit value. When the output from the limiter 1108 is "Ratio" and the output from the subtraction unit 1106 is "Resolution", "Ratio" can take a value from zero to "Resolution".

Further, because a subtraction unit 1113 subtracts "Ratio" from "Resolution", an output value of the subtraction unit 1113 is equal to "Resolution" when "Ratio" is 0, whereas the output value is 0 when "Ratio" is equal to "Resolution". An image A 1104 and an image A limit value 1105 are respectively multiplied by "Ratio" and "Resolution−Ratio", added together by an addition unit 1114, and divided by "Resolution" by a division unit 1115. Through the above configuration, the image A 1104 and the image A limit value 1105 are mixed at the ratio determined by the calculation "Ratio/Resolution".

In the present exemplary embodiment, a mixing ratio of the post-limit image A signal to the pre-limit image A signal is determined based on an addition signal, and a phase-difference detection type focus adjustment is executed using a signal mixed at the mixing ratio.

With this configuration, when the image A+B is not saturated, a correct value can be acquired regardless of the balance between the image A and the image B, and the limit value is applied to the image A when the image A+B is saturated. Further, because the limit value will not be abruptly applied thereto at the timing in which the image A+B is saturated, the waveform thereof will not be distorted. In the present exemplary embodiment, the circuit for smoothly switching to the limit processing has been described.

In the fourth exemplary embodiment, an imaging apparatus includes a first correlation calculation unit and a second correlation calculation unit. The first correlation calculation unit executes correlation calculation using the images A and B of FIG. 9A without applying the limit value to the image A, and the second correlation calculation unit executes correlation calculation using the images A and B of FIG. 9B which are obtained by employing the image A limiter unit 109 described in the first exemplary embodiment. In the present exemplary embodiment, the imaging apparatus uses the most reliable correlation calculation result by selecting from the correlation calculation result acquired by the first correlation calculation unit and the correlation calculation result acquired by the second correlation calculation unit. In the present exemplary embodiment, sum of absolute difference (SAD) is employed to determine a minimum value of the most reliable correlation calculation result.

The SAD serves as an index that indicates a degree of similarity between the most correlated images with respect to the disparity amount thereof. With this configuration, in a case where negative effect of the image A limiter unit 109 such as the distortion as illustrated in the portion 906 of FIG. 9B becomes greater than the beneficial effect of the image A limiter unit 109 such as improvement of the disparity amount, the correlation calculation result acquired using the waveforms of FIG. 9A is selected, thereby making it possible to acquire a preferable result.

In other words, according to the present exemplary embodiment, the imaging apparatus includes a reliability determination unit configured to perform reliability determination of a first phase-difference signal and a second phase-difference signal. The first phase-difference signal is acquired from a first image signal (image A signal) before suppression by the suppression unit and a second image signal (image B signal) that is calculated using the first image signal before suppression by the suppression unit. The second phase-difference signal is acquired from a first image signal after suppression by the suppression unit and a second image signal that is calculated using the first image signal after suppression by the suppression unit. In the imaging apparatus, the focus adjustment unit performs a phase-difference detection type focus adjustment using a phase-difference signal with higher reliability from among the first phase-difference signal and the second phase-difference signal.

Figure 12:
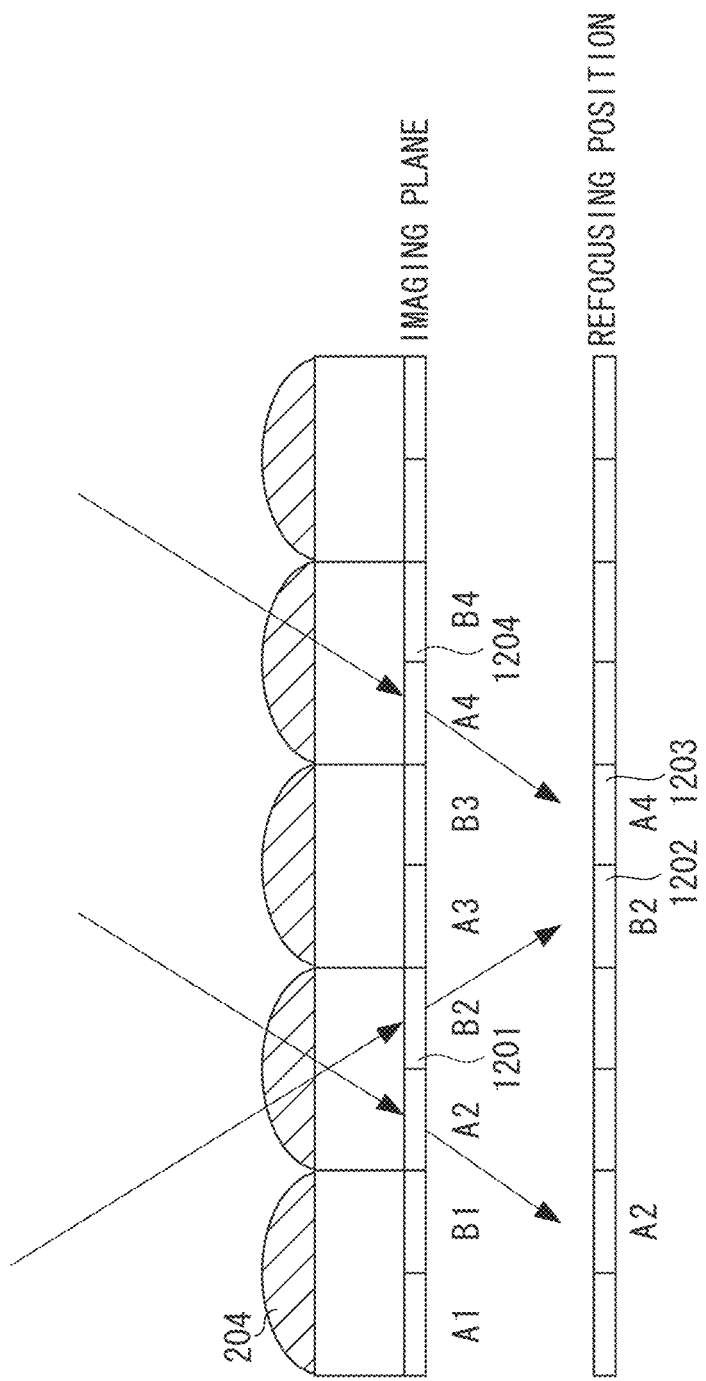
FIG. 12 is a schematic diagram of an image-forming surface, illustrating refocusing processing according to a fifth exemplary embodiment of the present invention.

In the first through fourth exemplary embodiments, the focus adjustment is executed by performing correlation calculation of the image A and the image B. In the fifth exemplary embodiment, refocusing processing will be executed. FIG. 12 is a schematic diagram of an image-forming surface illustrating the refocusing processing. The image sensor is configured of a microlens 204 and photoelectric conversion elements 1201 through 1204. The photoelectric conversion elements 1201 and 1204 are disposed on a surface of the image sensor, and the photoelectric conversion element 1201 is disposed on an image B pixel B2, that is the second image B pixel from the left.

The image A+B formed on an imaging plane is acquired by adding the signals of pixels A and B corresponding to the same microlens such as signals of pixels A1 and B1, or A2 and B2 in FIG. 12. Assuming that a plane slightly behind the imaging plane is a refocusing position, a light beam that enters the photoelectric conversion element 1201 will enter a sensor of the photoelectric conversion element 1202. Likewise, a light beam that enters the photoelectric conversion element 1204 will enter the photoelectric conversion element 1203.

According to the present exemplary embodiment, the imaging apparatus includes a subtraction unit and a suppression unit. One signal of a pair of signals is a first signal whereas the other signal of a pair of the signals is a second signal. The subtraction unit generates the second signal by subtracting the first signal output from the image sensor, from an addition signal acquired by adding the first signal and the second signal output from the image sensor, and the suppression unit suppresses the first signal to a value equal to or less than a predetermined value.

By employing the above-described principle, images obtained at front and rear positions of the imaging plane can be obtained in a pseudo manner by adding the signals of pixels A and B combining the photoelectric conversion elements 1202 and 1203. The technique according to the present invention can be also applied to the acquisition of the above-described refocusing image in addition to the focus detection.

In the sixth exemplary embodiment, in order to conform a predetermined value to a shading characteristic, the limit value is changed according to a position of the imaging plane or optical characteristics of a lens.

Figure 13A:
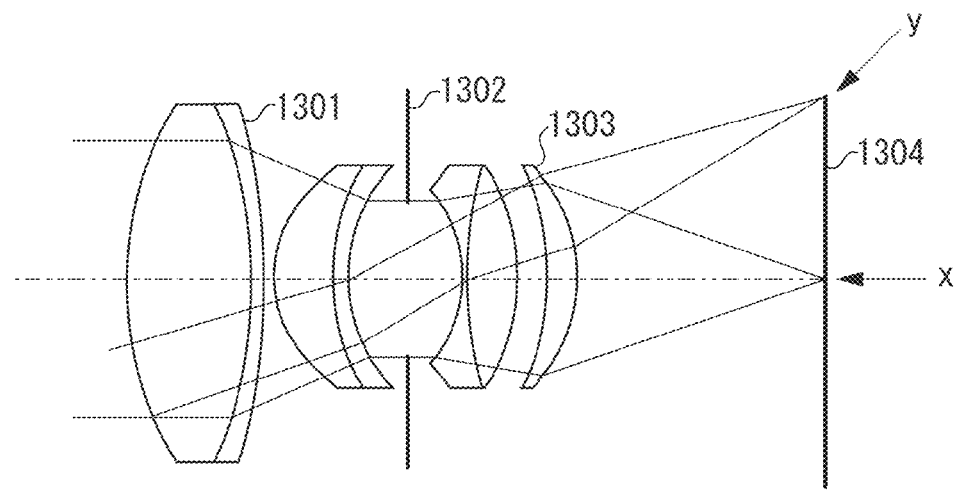
FIGS. 13A and 13B are diagrams illustrating shading characteristics according to a sixth exemplary embodiment of the present invention.

A cause of shading will be described with reference to a cross-sectional view of a lens illustrated in FIG. 13A. The lens includes a front lens 1301, a diaphragm 1302, and a rear lens 1303. A frame of the front lens 1301 is referred to as a front frame, whereas a frame of the rear lens 1303 is referred to as a rear frame. An imaging plane 1304 is located on the side of the rear lens 1303.

Figure 13B:
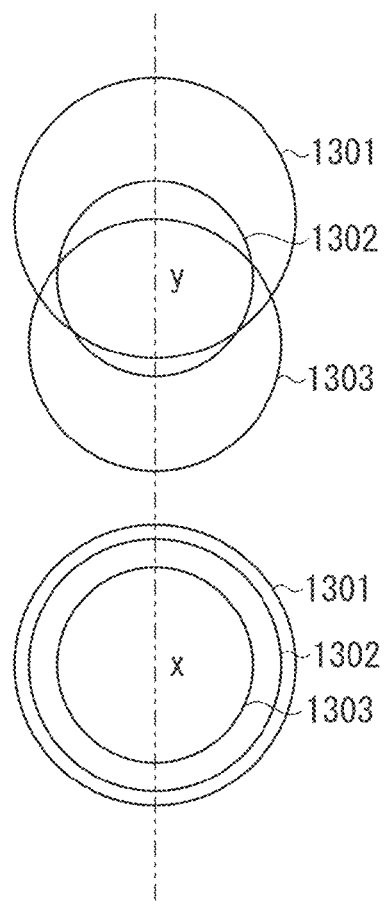

FIG. 13B is a diagram illustrating an overlapping state of respective frames of the front lens 1301, the diaphragm 1302, and the rear lend 1303, viewed from a position x and a position y of the imaging plane 1304. In FIG. 13B, only the diaphragm 1302 restricts the amount of light when viewed from the position x. However, when viewed from the position y, the front frame and the rear frame of the front lens 1301 and the rear lens 1303 also restrict the amount of light in addition to the restriction by the diaphragm 1302.

Figure 14:
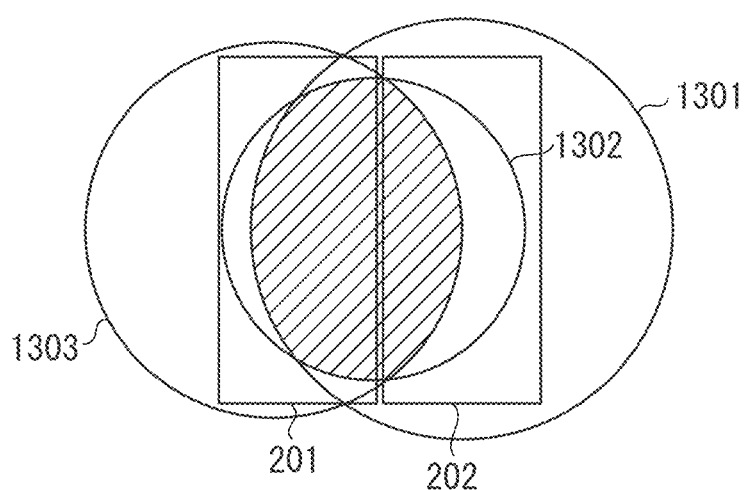
FIG. 14 is a front view illustrating an imaging plane of the image sensor according to the sixth exemplary embodiment of the present invention.

FIG. 14 is a diagram illustrating a state in which a light receiving range in the position y of FIG. 13B is overlapped with the photoelectric conversion units 201 and 202 of the image sensor. As illustrated in FIG. 14, the light receiving range is considerably different in the photoelectric conversion units 201 and 202. As described above, "shading" is a phenomenon in which the amount of light decreases as the imaging plane departs from the center of an optical axis to cause an image height to increase, and the pupil-divided image has characteristics in that the image becomes off-balance as the image height thereof increases.

In the first exemplary embodiment, the limit value 102 is set to half the saturation level of the image A+B. However, a ratio of signal level of the pixels on the in-focus plane, or a ratio of signal level of the pixels A to B is approximately the same as the value of shading variation. Accordingly, the limit value may desirably conform to a shading balance ratio.

As described above with reference to FIG. 13, the state of shading is influenced by a size of the lens frame and a distance between the imaging plane and the lens frame.

In the sixth exemplary embodiment, the limit value is changed according to the position of the imaging plane. The limit value is also changed according to the configuration of the lens.

In the first through sixth exemplary embodiments, the microlens including two photoelectric conversion units is described. However, the same effect as described above can be obtained if the microlens includes more than two photoelectric conversion units. Furthermore, in the first and second exemplary embodiments, the RGB color filters arranged in the Bayer array has been described. However, the same effect can be obtained by arrays of complementary color filters.

Preferred exemplary embodiments according to the present invention have been described as the above. However, the present invention is not limited to the above exemplary embodiments, and many variations and modifications are possible within the scope of the present invention.

According to the present invention, in a system for subtracting one signal from an addition signal, a saturation signal can be processed properly.

OTHER EMBODIMENTS

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-058767 filed Mar. 21, 2013, which is hereby incorporated by reference herein in its entirety.

What is claimed is:

1. An imaging apparatus including an image sensor having a plurality of photoelectric conversion units, and a focus adjustment unit for performing a phase-difference detection type focus adjustment using a pair of image signals detected by a plurality of the photoelectric conversion units, the imaging apparatus comprising:
a subtraction unit configured to obtain a second image signal by subtracting a first image signal output from the image sensor from an addition signal acquired as a sum of the first image signal and the second image signal output from the image sensor in a case where the pair of the image signals includes the first image signal and the second image signal; and
a suppression unit configured to suppress the first image signal to a value equal to or less than a predetermined value before subtracting the first image signal from the addition signal.

2. The imaging apparatus according to claim 1, wherein the image sensor includes a pixel having the plurality of photoelectric conversion units and the predetermined value changes according to a position of the imaging pixel in an imaging plane and/or optical characteristics of an image optical system.

3. The imaging apparatus according to claim 1, wherein the image sensor amplifies and outputs the first image signal and the second image signal.

4. The imaging apparatus according to claim 3, wherein the suppression unit changes the predetermined value based on an amplification degree of the first image signal and the second image signal output from the image sensor.

5. The imaging apparatus according to claim 1, wherein the imaging apparatus determines a mixing ratio of the first image signal after suppression by the suppression unit based on the addition signal to the first image signal before suppression by the suppression unit; and wherein the focus adjustment unit performs a phase-difference detection type focus adjustment using a signal mixed at the mixing ratio.

6. The imaging apparatus according to claim 5, further comprising:
a reliability determination unit configured to perform reliability determination of a first phase-difference signal and a second phase-difference signal, wherein the first phase-difference signal is acquired from the first image signal before suppression by the suppression unit and the second image signal calculated using the first image signal before suppression by the suppression unit, and the second phase-difference signal is acquired from the first image signal after suppression by the suppression unit and the second image signal calculated using the first image signal after suppression by the suppression unit;

wherein the focus adjustment unit performs a phase-difference detection type focus adjustment using one of the first phase-difference signal and the second phase-difference signal having higher reliability.

7. The imaging apparatus according to claim 6, wherein the reliability of the phase-deference signals is determined based on a sum of absolute differences.

8. The imaging apparatus according to claim 5, wherein the mixing ratio is determined based on the addition signal.

9. The imaging apparatus according to claim 1, wherein the image sensor is configured to read the first image signal into only an area used for focusing adjustment.

10. The imaging apparatus according to claim 1, wherein the image sensor is configured to read the first image signal into only an area used for focusing adjustment.

11. The imaging apparatus according to claim 1,
wherein the image sensor includes a plurality of microlens and a plurality of photoelectric conversion units for each microlens, and
wherein the pair of image signals is detected by the plurality of the photoelectric conversion units for each microlens.

12. The imaging apparatus according to claim 11, further comprising a refocus unit configured to perform a refocusing processing by adding the image signals detected by the plurality of photoelectric conversion units corresponding to a different microlens among the plurality of microlenses.

13. The imaging apparatus according to claim 1, wherein the suppression unit suppresses the first image signal to the value equal to or less than a predetermined value in a case that the first image signal is more than a limit value.

14. The imaging apparatus according to claim 1,
wherein the suppression unit suppresses the first image signal before subtracting the first image signal from the addition signal, and
wherein the image sensor is designed to read the first image signal into only an area used for the focus adjustment.

15. An imaging apparatus including an image sensor having a plurality of photoelectric conversion units and outputs a pair of signals detected by a plurality of the photoelectric conversion units, the imaging apparatus comprising:
a subtraction unit configured to obtain a second signal by subtracting a first signal output from the image sensor from an addition signal acquired as a sum of the first signal and the second signal output from the image sensor in a case where the pair of the signals includes the first signal and the second signal; and
a suppression unit configured to suppress the first signal to a value equal to or less than a predetermined value before subtracting the first image signal from the addition signal.

* * * * *